US006365529B1

(12) United States Patent
Hussein et al.

(10) Patent No.: US 6,365,529 B1
(45) Date of Patent: Apr. 2, 2002

(54) METHOD FOR PATTERNING DUAL DAMASCENE INTERCONNECTS USING A SACRIFICIAL LIGHT ABSORBING MATERIAL

(75) Inventors: Makarem A. Hussein, Beaverton; Sam Sivakumar, Hillsboro, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/501,354

(22) Filed: Feb. 9, 2000

Related U.S. Application Data

(63) Continuation-in-part of application No. 09/337,366, filed on Jun. 21, 1999.

(51) Int. Cl.⁷ .............................................. H01L 21/31
(52) U.S. Cl. ........................ 438/780; 438/618; 438/637; 438/689; 438/695; 438/700
(58) Field of Search ................... 438/780, 618, 438/637, 689, 695, 700, 704, 710, 745

(56) References Cited

U.S. PATENT DOCUMENTS

| 4,587,138 A | 5/1986 | Yau et al. |
| 4,910,122 A | 3/1990 | Arnold et al. |
| 5,268,330 A | 12/1993 | Givens et al. |
| 5,652,176 A | 7/1997 | Maniar et al. |
| 5,688,617 A | 11/1997 | Mikami et al. |
| 5,693,568 A | 12/1997 | Liu et al. |
| 5,702,982 A | 12/1997 | Lee et al. |
| 5,721,601 A | 2/1998 | Yamaji et al. |
| 5,892,096 A | 4/1999 | Meador et al. |
| 5,897,379 A | 4/1999 | Ulrich et al. |
| 5,900,668 A | 5/1999 | Wollesen |
| 6,033,977 A * | 3/2000 | Gutsche et al. ............. 438/618 |
| 6,037,255 A * | 3/2000 | Hussein et al. ............. 438/675 |
| 6,057,239 A * | 5/2000 | Wang et al. ................. 438/689 |
| 6,090,671 A | 7/2000 | Balasubramanyam et al. |

OTHER PUBLICATIONS

R. R. Kunz et al. "Materials Evaluation of Antireflective Coatings For Single–Layer 193–nm Lithography" SPIE Proceedings, vol. 2195 Feb.–Mar. 1994, San Jose, CA, pp 447–460.

* cited by examiner

Primary Examiner—David Nelms
Assistant Examiner—Renee' R Berry
(74) Attorney, Agent, or Firm—Mark V. Seeley

(57) ABSTRACT

An improved method of forming an integrated circuit, which includes forming a conductive layer on a substrate, then forming a dielectric layer on the conductive layer. After forming the dielectric layer, a layer of photoresist is patterned to define a region to be etched. A first etched region is then formed by removing a first portion of the dielectric layer. That first etched region is filled with a preferably light absorbing sacrificial material having dry etch properties similar to those of the dielectric layer. A second etched region is then formed by removing the sacrificial material and a second portion of the dielectric layer. This improved method may be used to make an integrated circuit that includes a dual damascene interconnect.

20 Claims, 12 Drawing Sheets

METHOD FOR PATTERNING DUAL DAMASCENE INTERCONNECTS USING A SACRIFICIAL LIGHT ABSORBING MATERIAL

This is a continuation-in-part application of U.S. application Ser. No. 09/337,366, filed Jun. 21, 1999.

FIELD OF THE INVENTION

The present invention relates to a method for making integrated circuits.

BACKGROUND OF THE INVENTION

Dual damascene metal interconnects may enable reliable low cost production of integrated circuits using sub 0.25 micron process technology. Before such interconnects can realize their full potential, however, two problems related to the process for making them must be addressed. The first relates to the lithography for defining dual damascene vias and trenches. The second relates to the selectivity of certain materials, which are used to make dual damascene devices, to the etch chemistry used to etch the vias and trenches.

The lithographic process used to define dual damascene features can be relatively complex. Unlike conventional processes, which only require patterning of vias, processes for making dual damascene structures also require patterning of line/space combinations for trenches that will be etched into relatively thick transparent layers of dielectric. Those dielectric layers lie on top of various other layers, which may be made of metal or other materials. Those layers have different optical properties. As a result, when light strikes the surface of such a substrate, it may be reflected in a non-uniform and uncontrollable fashion. Such non-uniformity may cause the critical dimension ("CD") control across the wafer to be poor.

Dielectric and organic anti-reflective coatings ("ARCs") may be used to reduce substrate reflection. Using such materials, however, does not solve the lithography and etch problems of current processes for patterning integrated dual damascene structures. As to structures made using organic ARCs, such structures may include defects that result from the difference in etch rate between the dielectric layer and the ARC. As to dielectric ARC containing structures, such structures may not adequately absorb light, at the wavelength used during the exposure step of the lithographic process, to significantly reduce or eliminate the reflection problem. In general, ARCs rely mostly on creating destructive interference modes at the ARC/photoresist interface to reduce substrate reflectivity.

In addition to the lithographic problem, the selectivity to certain etch chemistry of the dielectric layer to the underlying etch stop material must be reduced. Copper may then be used to fill the trenches and vias, which were previously formed within a dielectric material, when forming a dual damascene structure. To make such a device, a thin layer of silicon nitride may be formed on top of an underlying copper layer to protect that layer from processes used to clean the previously etched via and trench. When the via and trench are formed within a silicon dioxide layer, an etch chemistry having a very high selectivity for silicon dioxide over silicon nitride must be used when forming the trench.

Trenches formed by such a process may be between about 3,000 and about 16,000 angstroms deep. When forming such trenches, a selectivity of silicon dioxide to silicon nitride of between about 17 and about 50 (or even greater) may be required to prevent the trench etch process from etching through the exposed portion of the silicon nitride layer, located at the bottom of the via.

Developing an etch chemistry that provides such high selectivity may be difficult. In addition, the degree of selectivity may be inversely proportional to the quality of the profiles and etch bias that result from the etch process. This effect may make it difficult to balance the need for high selectivity with the desirability of acceptable profile and etch bias performance to ensure correct patterning. If the selectivity is too high, the etch process may adversely impact via and trench profiles or increase the density of defects, e.g., from excessive polymer build-up. In addition, a relatively thick silicon nitride layer may be required to ensure that the trench etching step will not break through the silicon nitride to the underlying copper. Use of such a thick layer may not be practical if it negatively impacts the dielectric layer's overall dielectric constant.

One way to address this problem is to form an etch resistant plug within the via, prior to the trench etch step, to prevent the silicon nitride barrier layer from being exposed to chemistry used during the trench etching and cleaning process. An organic material, such as photoresist, or an organic ARC may be used to form such an etch resistant plug. However, because of the difference in etch rates between such an organic based plug and the dielectric layer, patterning defects known as "shells" or "fences" may form during the patterning of the dual damascene structures. Eliminating such defects without breaking through the silicon nitride layer may be a difficult process.

Accordingly, there is a need for a process that solves both the lithography and etch problems that may arise in current processes for forming dual damascene structures. There is a need for a process that transforms a typical reflective substrate into a non-reflective one that absorbs light during the lithographic process. There is also a need for a process for patterning a trench and via for making an integrated circuit having a copper containing dual damascene structure, which does not require use of a high selectivity etch to form the trench. There is a need for a method for forming such a structure that may provide superior via and trench profiles, which are substantially vertical, while generating fewer defects. In addition, there is a need for a process that permits the use of a thinner silicon nitride layer over an underlying copper layer. Using such a thin layer increases the ratio of silicon dioxide (or other material used to form the dielectric layer) to silicon nitride thickness, which should enhance the device's dielectric properties.

SUMMARY OF THE INVENTION

An improved method for making an integrated circuit is described. That method comprises depositing a dyed base material on a substrate having a reflective surface, patterning a layer of photoresist on the dyed base material, and then exposing the photoresist layer to light that the dyed base material absorbs, which reduces the amount of light reflected from the underlying substrate to a level below that which would otherwise have been reflected. Also described is a composition comprising a spin-on-glass or spin-on-polymer material that includes a light absorbing dye, which may be used in such a process.

In another embodiment of the present invention, an improved method for forming an integrated circuit comprises forming a conductive layer on a substrate, then forming a dielectric layer on the conductive layer. A layer of photoresist is then patterned to define a region to be etched. A first etched region is formed by removing a first portion of the dielectric layer. That first etched region is then filled with a sacrificial material having dry etch properties similar to those of the dielectric layer—and preferably also having light absorbing properties that enable the substrate to absorb light during the lithographic exposure step. A second etched region is then formed by removing the sacrificial material and a second portion of the dielectric layer.

In still another embodiment of the present invention, an antireflective layer may be formed on the surface of the sacrificial material, after the sacrificial material has filled the first etched region. A second etched region is then formed by removing the antireflective layer, the sacrificial material and a second portion of the dielectric layer. When used to make copper containing dual damascene structures, these processes allow for the patterning of structures with reduced CDs and pitches.

DETAILED DESCRIPTION OF THE PRESENT INVENTION

Figure 1A:
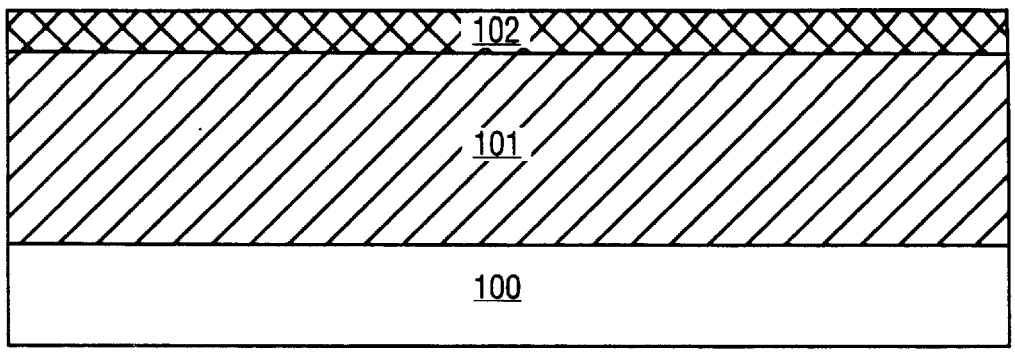
FIGS. 1a–1h illustrate cross-sections that reflect structures that may result after certain steps are used to make a copper containing dual damascene device following one embodiment of the method of the present invention.

Set forth below is a description of a number of embodiments of the method of the present invention, presented in the context of making a device that includes a copper containing dual damascene interconnect. That description is made with reference to FIGS. 1a–1h, 2a–2g, and 3a–3c, which illustrate cross-sections of structures that result after using certain steps.

In the method of the present invention, first conductive layer 101 is formed on substrate 100. Substrate 100 may be any surface, generated when making an integrated circuit, upon which a conductive layer may be formed. Substrate 100 thus may include, for example, active and passive devices that are formed on a silicon wafer such as transistors, capacitors, resistors, diffused junctions, gate electrodes, local interconnects, etc. . . . Substrate 100 also may include insulating materials (e.g., silicon dioxide, either undoped or doped with phosphorus (PSG) or boron and phosphorus (BPSG); silicon nitride; silicon oxynitride; or a polymer) that separate such active and passive devices from the conductive layer or layers that are formed on top of them, and may include previously formed conductive layers.

Conductive layer 101 may be made from materials conventionally used to form conductive layers for integrated circuits. For example, conductive layer 101 may be made from copper, a copper alloy, aluminum or an aluminum alloy, such as an aluminum/copper alloy. Alternatively, conductive layer 101 may be made from doped polysilicon or a silicide, e.g., a silicide comprising tungsten, titanium, nickel or cobalt.

Conductive layer 101 may include a number of separate layers. For example, conductive layer 101 may comprise a primary conductor made from an aluminum/copper alloy that is sandwiched between a relatively thin titanium layer located below it and a titanium, titanium nitride double layer located above it. Alternatively, conductive layer 101 may comprise a copper layer formed on underlying barrier and seed layers.

Conductive layer 101 may be formed by a chemical vapor or physical deposition process, like those that are well known to those skilled in the art. Alternatively, where copper is used to make conductive layer 101, a conventional copper electroplating process may be used. Examples of such a process are described in copending applications Ser. Nos. 163,847 and 223,472 (filed Sep. 30, 1998 and Dec. 30, 1998, respectively, and each assigned to this application's assignee). Other techniques for applying an electroplating process to form copper containing conductive layers are well known to those skilled in the art.

Although a few examples of the types of materials that may form conductive layer 101 have been identified here, conductive layer 101 may be formed from various other materials that can serve to conduct electricity within an integrated circuit. Although copper is preferred, the use of any other conducting material, which may be used to make an integrated circuit, falls within the spirit and scope of the present invention.

After forming conductive layer 101 on substrate 100, barrier layer 102 is formed on conductive layer 101. Barrier layer 102 will serve to prevent an unacceptable amount of copper, or other metal, from diffusing into dielectric layer 103. Barrier layer 102 also acts as an etch stop to prevent subsequent via and trench etch steps from exposing conductive layer 101 to subsequent cleaning steps. Barrier layer 102 preferably is made from silicon nitride, but may be made from other materials that can serve such functions, e.g., titanium nitride or oxynitride, as is well known to those skilled in the art.

When formed from silicon nitride, a chemical vapor deposition process may be used to form barrier layer 102. Barrier layer 102 should be thick enough to perform its diffusion inhibition and etch stop functions, but not so thick that it adversely impacts the overall dielectric characteristics resulting from the combination of barrier layer 102 and dielectric layer 103. To balance these two factors, the thickness of barrier layer 102 preferably should be less than about 10% of the thickness of dielectric layer 103.

Conductive layer 101 and barrier layer 102 may be planarized, after they are deposited, using a CMP step. FIG. 1a illustrates a cross-section of the structure that results after conductive layer 101 and barrier layer 102 have been formed on substrate 100.

Dielectric layer 103 is then formed on top of barrier layer 102. Dielectric layer 103 preferably comprises silicon dioxide, which is deposited on the surface of barrier layer 102 using a conventional plasma enhanced chemical vapor deposition (PECVD) process that employs tetraethylorthosilicate (TEOS) as the silicon source. Although preferably made of silicon dioxide, dielectric layer 103 may be made from other materials that may insulate one conductive layer from another, as will be apparent to those skilled in the art. For example, dielectric layer 103 may comprise an organic polymer selected from the group that includes polyimides, parylenes, polyarylethers, polynaphthalenes, and polyquinolines, or copolymers thereof. Alternatively, dielectric layer 103 may comprise fluorinated silicon dioxide or a porous silicon dioxide, e.g., silicon dioxide doped with carbon. Dielectric layer 103 preferably has a thickness of between about 2,000 and about 20,000 angstroms.

Figure 1B:
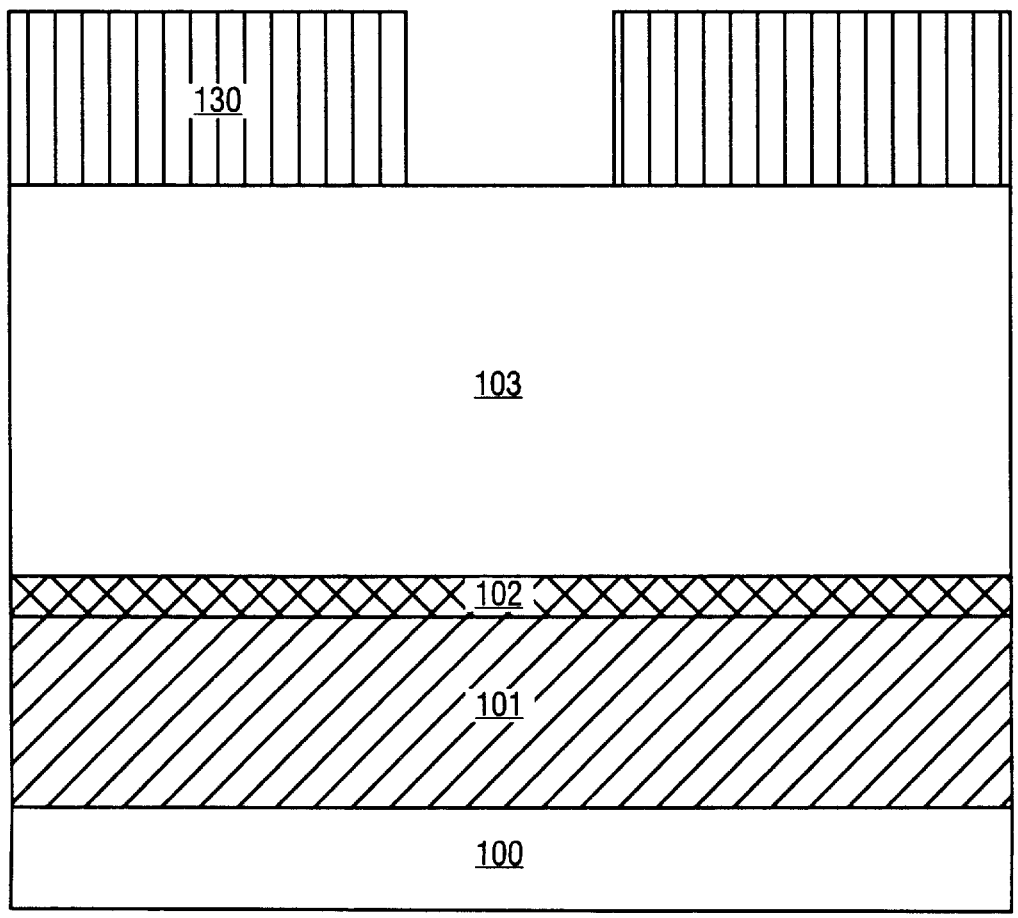
Figure 1C:
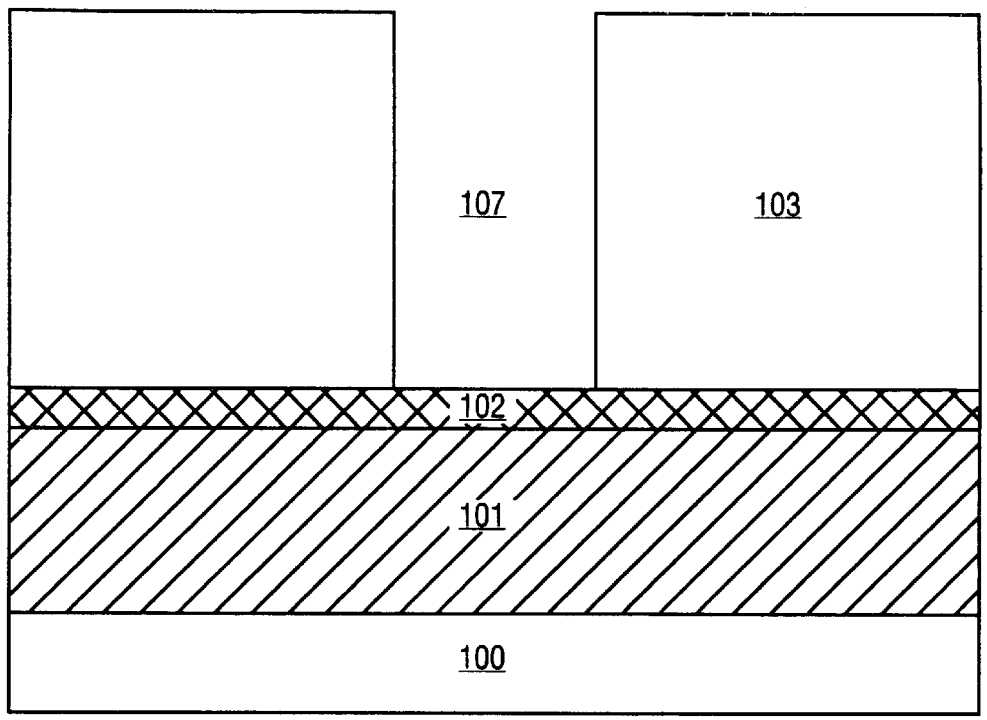

After forming dielectric layer 103, a photoresist layer 130 is patterned on top of it to define a via formation region for receiving a subsequently formed conductive layer that will contact conductive layer 101. Photoresist layer 130 may be patterned using conventional photolithographic techniques, such as masking the layer of photoresist, exposing the masked layer to light, then developing the unexposed portions. The resulting structure is shown in FIG. 1b. Although this particular embodiment does not specify forming a hard mask on top of dielectric layer 103 prior to applying the photoresist, such a hard mask may be desirable when using certain types of material to form dielectric layer 103, as is well known to those skilled in the art.

After photoresist 130 is patterned, via 107 is etched through dielectric layer 103 down to barrier layer 102. Conventional process steps for etching through a dielectric layer may be used to etch the via, e.g., a conventional anisotropic dry oxide etch process. When silicon dioxide is used to form dielectric layer 103, the via may be etched using a medium density magnetically enhanced reactive ion etching system ("MERIE system") using fluorocarbon chemistry. When a polymer is used to form dielectric layer 103, a forming gas chemistry, e.g., one including nitrogen and either hydrogen or oxygen, may be used to etch the polymer—as described in Ser. No. 09/310,656, filed May 12, 1999, and assigned to this application's assignee.

Barrier layer 102 acts as an etch stop to protect conductive layer 101 from being exposed to subsequent process steps. Because of nonuniformity in the thickness of dielectric layer 103, and oxide etch variability, an overetch step may be necessary. Such an overetch step may consume about 20–30% of barrier layer 102. Conventional post etch ashing and via clean steps may follow the via etch step to produce the structure shown in FIG. 1c. Via 107 may be cleaned by using a conventional HF in ethylene glycol based wet etch process, as is well understood by those skilled in the art.

In processes that form a hard masking layer on top of dielectric layer 103, a two step process may be used to etch the via—the first step etching through the exposed portion of the hard mask and the second step etching through the underlying dielectric layer.

Figure 1D:
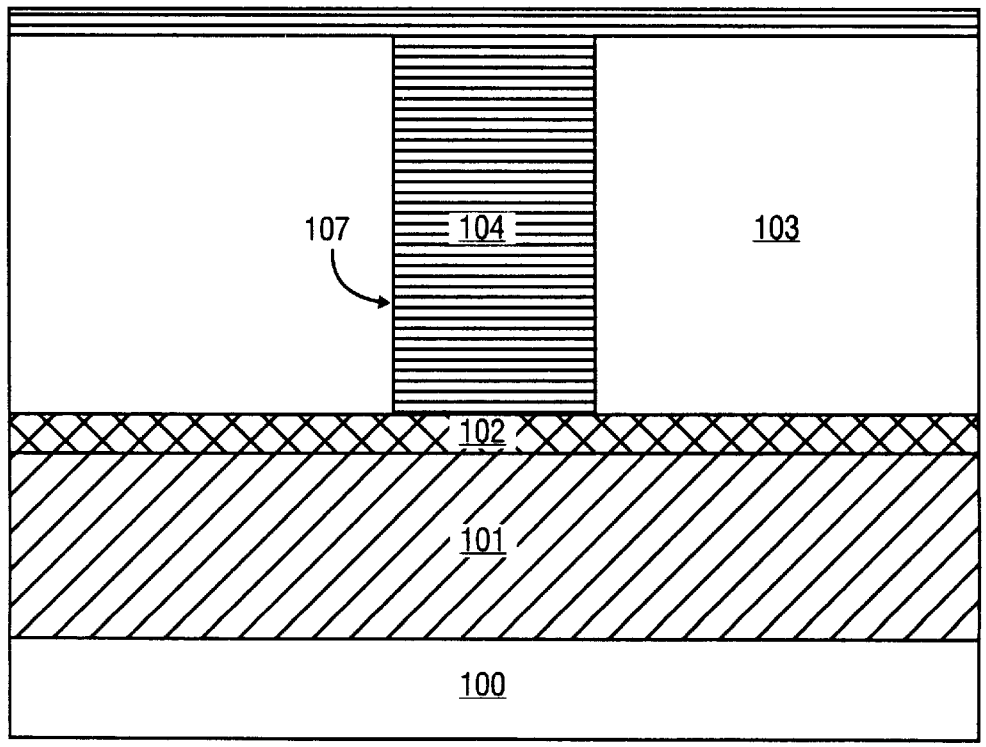

After via 107 is formed through dielectric layer 103, via 107 is filled with sacrificial material 104, generating the structure shown in FIG. 1d. Sacrificial material 104 has dry etch properties similar to those of dielectric layer 103. Preferably, sacrificial material 104 comprises a spin-on-polymer (SOP) or spin-on-glass (SOG) that is deposited by spin coating between about 500 and about 3,000 angstroms of the material onto the surface of the device, using conventional process steps. Although only a thin layer remains on the surface of the device, such a spin coating process causes sacrificial material 104 to substantially, or completely, fill via 107. In this embodiment of the present invention, sacrificial material 104 preferably should etch at a slightly faster rate than dielectric layer 103, when subjected to the chosen dry etch chemistry.

Whether an SOP or SOG material is used for sacrificial material 104 may depend upon the type of material used to form dielectric layer 103. If dielectric layer 103 is formed from silicon dioxide, using an SOG material to form sacrificial material 104 should yield a better match between their respective etch rates. If dielectric layer 103 is formed from a polymer, then forming sacrificial material 104 from an SOP material may produce a combination of materials having the desired selectivity. If dielectric layer 103 includes a porous silicon dioxide, whether an SOG or SOP material is etched at a rate that more closely matches the etch rate of the dielectric layer may depend upon the amount of carbon that is included in the porous silicon dioxide layer.

In addition to having dry etch properties like those of dielectric layer 103, sacrificial material 104 should uniformly fill via 107 and have a wet etch rate that is significantly faster than the wet etch rate for dielectric layer 103. Such dry etch properties should enable removal of substantially all of the sacrificial material from the bottom of the via at the end of the trench etch process. The uniform fill characteristic minimizes void formation, which could jeopardize the integrity of the filling and/or may expose the underlying silicon nitride layer, for an undesirable extended period of time, to etch chemistry used to form the trench. The selectivity of sacrificial material 104 to the wet etch enables removal of that material from the surface of the device, as well as from inside via 107.

When sacrificial material 104 is transparent, high substrate reflectivity (and reflectivity variation across devices), which results during the exposure step of the lithographic process used to define the trench, may adversely affect the ability to control CDs and their uniformity. That effect may become more pronounced as those CDs shrink.

Using a dyed SOP or SOG for sacrificial material 104 should enable control of such substrate reflectivity. By dying such a base material with certain organic or inorganic substances, that base material may become opaque. By using a dyed base material for sacrificial material 104, changes in substrate reflectivity may be reduced, which may enable the photolithographic process to produce improved results. The organic or inorganic material chosen for the dye preferably should absorb light that is used during the exposure step of the photolithographic process. Preferably, the quantity and type of light absorbing dye, which is added to the base sacrificial material, should enable appreciable absorption of light having a wavelength identical to that used to expose the photoresist to pattern it. For example, the dye type and amount, and the type of base material, used to form the sacrificial material may be selected and tuned to absorb i-line (e.g., 365 nm), deep ultraviolet (e.g., 248 nm and 193 nm), or shorter, wavelengths.

When selecting the type of dye to add to the SOP, SOG, or other sacrificial material, and the amount to add, one should ensure that the resulting composition does not compromise the filling capability of the sacrificial material. In addition, when selecting the kind of dye used, and the amount used, one should ensure that the wet etch selectivity of the resulting dyed sacrificial material to the dielectric layer remains high, and that the dry etch selectivity of the sacrificial material to the dielectric layer is close to 1:1.

Although this embodiment of the present invention describes using a dyed base material to reduce substrate reflectivity in the context of a process for making an integrated circuit that includes a dual damascene interconnect, this technique may be used in many other applications. As a general matter, coating a substrate with such a dyed material should suppress light reflection from underlying layers and, hence, improve lithographic performance. For that reason, the present invention is not limited to application of this technique in the dual damascene context, but instead applies broadly to any process that benefits from the use of a non-reflective surface to improve lithography.

Figure 1E:
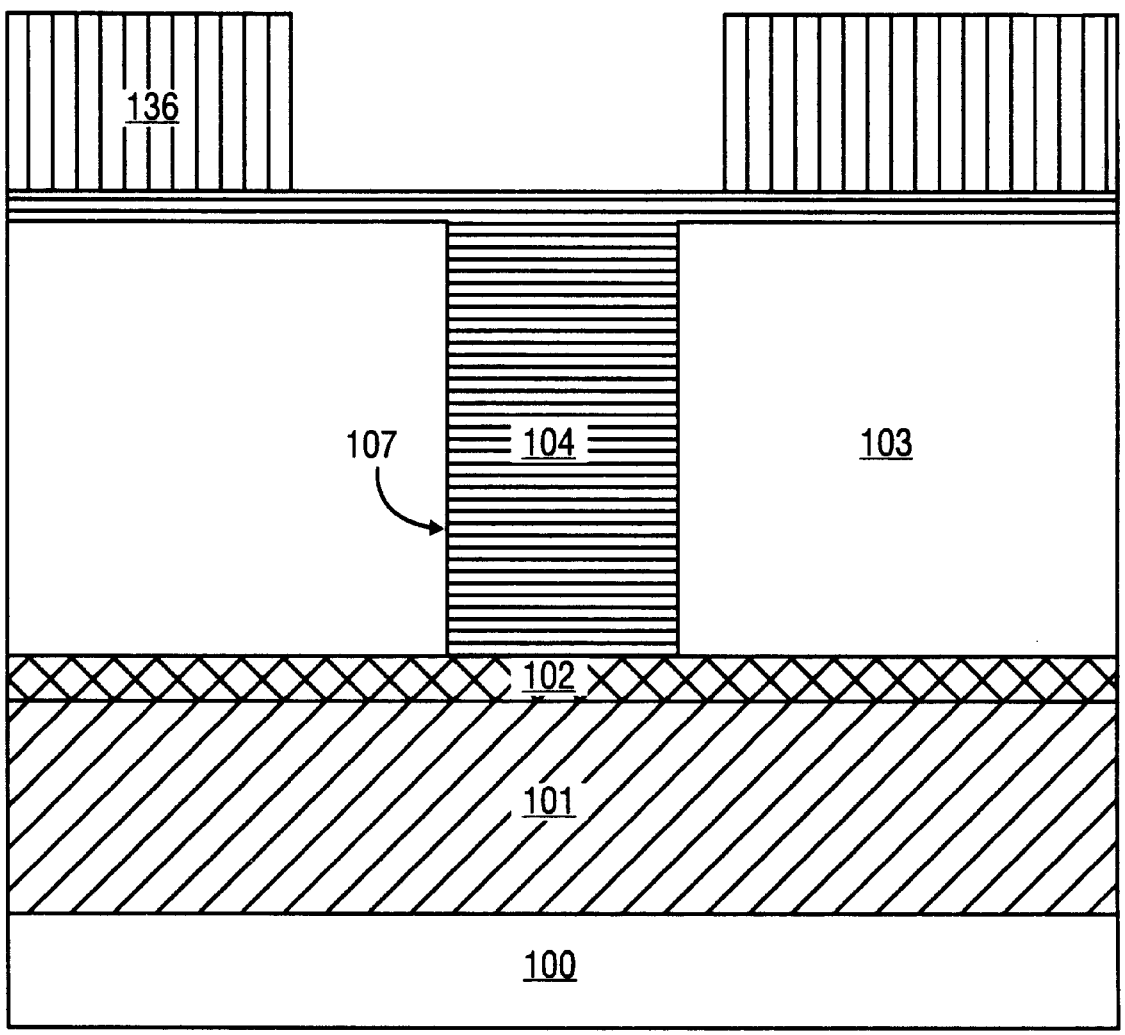
Figure 1F:
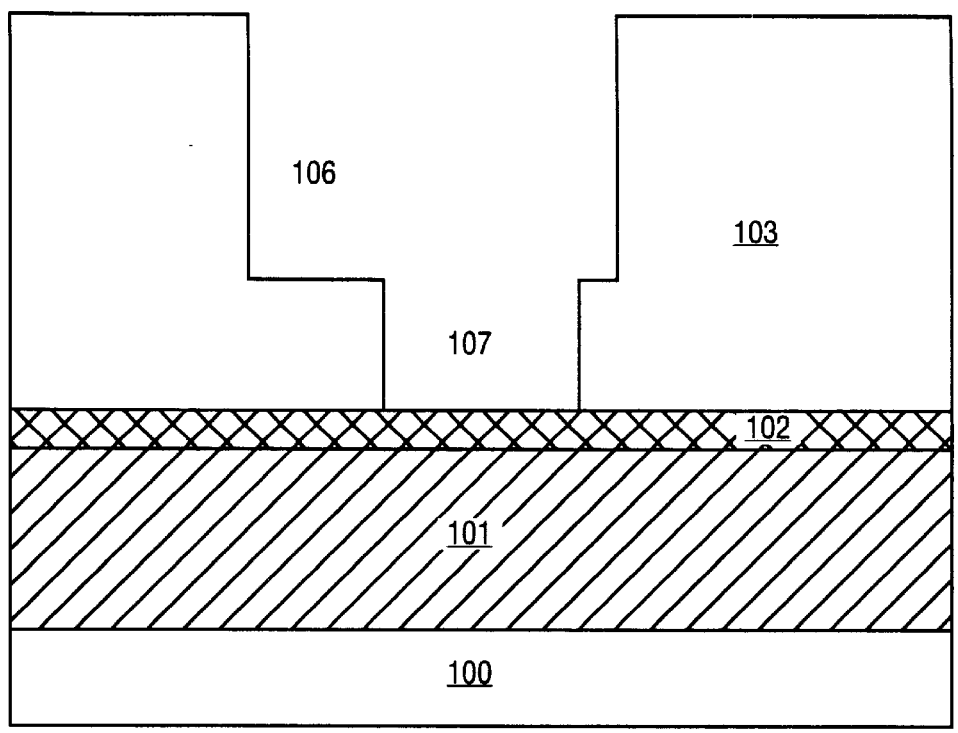
Figure 1G:
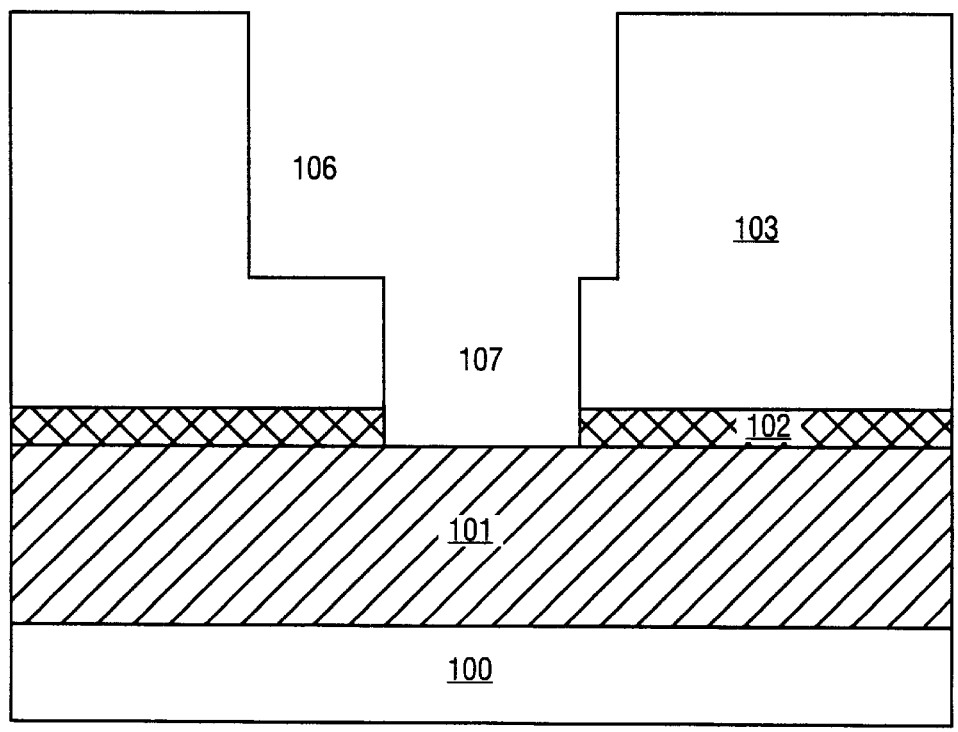

After filling via 107 with sacrificial material 104, photoresist layer 136 is applied on top of layer 104, then patterned to define a trench formation region. Photoresist layer 136 may be patterned using conventional photolithographic techniques. The resulting structure is shown in FIG. 1e. Following that photoresist patterning step, trench 106 is etched into dielectric layer 103 to form the structure shown in FIG. 1f.

The etching process is applied for a time sufficient to form a trench having the desired depth. The etch chemistry chosen to etch trench 106 preferably should remove sacrificial material 104 at a slightly faster rate than it removes dielectric layer 103, to avoid formation of defects. Trench 106 may be etched using the same equipment and etch chemistry that had been used previously to etch via 107. As with the via etch step, barrier layer 102 may act as an etch stop during the trench etching process, protecting the underlying conductive layer from the etch step and any subsequent ashing or cleaning steps. In addition, the presence of any portion of sacrificial material 104 that remains at the bottom of via 107 after the trench etch step may help ensure that conductive layer 101 will not be affected by the trench etch process.

By filling via 107 with a sacrificial material having dry etch characteristics like those of dielectric layer 103, the trench lithography process effectively applies to a substantially "hole-free" surface, similar to one without vias. By selecting an appropriate SOP or SOG material for sacrificial material 104, and an appropriate etch chemistry, trench 106 may be etched into dielectric layer 103 at a rate that is almost as fast as sacrificial material 104 is removed. Such a process protects the underlying barrier layer 102 during the etching of trench 106. Such a process thus permits the use of a trench etch chemistry that produces superior trench and via profiles without having to consider the effect such etch chemistry has on the selectivity between dielectric layer 103 and barrier layer 102.

For example, when dielectric layer 103 comprises silicon dioxide and barrier layer 102 comprises silicon nitride, an etch chemistry may be used to etch the trench that does not provide a high selectivity of silicon dioxide to silicon nitride. In addition, because the process of the present invention reduces the amount of time during which barrier layer 102 is etched during the trench etch process, the thickness of barrier layer 102, e.g., a silicon nitride layer, when initially deposited, may be reduced to less than about 600 angstroms.

When a dyed base material is used for sacrificial material 104, the lithography subsequently used to pattern lines and spaces may be improved by reducing the amount of substrate reflectivity. This ensures that substrate reflectivity will be more uniform and controllable, which enables better CD control. Better CD control should enable use of sub 0.25 micron processes to make integrated circuits with dual damascene structures.

The method of the present invention thus allows for improved lithographic performance for defining line and space patterns, and allows for the use of an etch chemistry that enables vias and trenches with improved, substantially vertical, profiles to be formed—without regard to selectivity of the dielectric layer to the underlying barrier layer. In addition, by allowing for the use of a thinner barrier layer than might otherwise be required, the method of the present invention may enable the making of a device having improved dielectric properties.

After trench 106 is etched, cleaning steps follow to remove photoresist 136 and residues that may remain on the device's surface and inside the vias. Photoresist 136 may be removed using a conventional ashing step. Following such an ashing step, to ensure removal of remaining portions of sacrificial material 104, a wet etch step having a significantly higher selectivity for sacrificial material 104 over dielectric layer 103 should be used. When dielectric layer 103 comprises silicon dioxide and sacrificial material 104 comprises SOG, a 50:1 buffered oxide etch process should ensure that the remaining SOG material is removed at a substantially faster rate than the silicon dioxide. Alternatively, depending upon the type of SOG or SOP, and dielectric material used, other wet etch chemistry may be used, e.g., chemistry based on commercially available amine based materials. Irrespective of the chemistry chosen for the wet etch, high selectivity between the sacrificial layer and the dielectric layer must be maintained.

Barrier layer 102 protects conductive layer 101 from exposure to the solvents and/or oxidizing environment used when cleaning the trench. After that cleaning step, the portion of barrier layer 102 that separates via 107 from conductive layer 101 may be removed to expose conductive layer 101. A low polymer producing chemistry is preferably used to remove that portion of barrier layer 102, as is well understood by those skilled in the art.

Barrier layer 102 removal may be followed by a short wet etch (which employs an etch chemistry that is compatible with the material used to form conductive layer 101) to clear etch residue from the surface of conductive layer 101. When copper is used to make the conductive layers, that portion of barrier layer 102 should be removed, using a copper compatible chemistry, before any copper electroplating step is applied to fill via 107 and trench 106. Removal of barrier layer 102 produces the structure shown in FIG. 1g.

Following that barrier layer removal step, trench 106 and via 107 are filled with second conductive layer 105. Conductive layer 105 may comprise any of the materials identified above in connection with conductive layer 101. Conductive layer 105 may comprise the same conductive material as conductive layer 101, or may comprise a conductive material different from the material used to make conductive layer 101.

Conductive layer 105 preferably comprises copper, and is formed using a conventional copper electroplating process, in which a copper layer is formed on barrier and seed layers used to line trench 106 and via 107. The barrier layer may comprise a refractory material, such as titanium nitride, but may also include an insulating material, such as silicon nitride. Such an insulating barrier layer should be removed from the bottom of the via to allow conductive layer 105 to contact the underlying metal, as described in Ser. No. 163,847, filed Sep. 30, 1998 and assigned to this application's assignee. The barrier layer formed beneath conductive layer 105 preferably is between about 100 and 500 angstroms thick. Suitable seed materials for the deposition of copper include copper and nickel.

As with conductive layer 101, although copper is preferred, conductive layer 105 may be formed from various materials that can serve to conduct electricity within an integrated circuit. When an excess amount of the material used to make layer 105 is formed on the surface of dielectric layer 103, a CMP step may be applied to remove the excess material and to planarize the surface of layer 105. When an electroplating process is used to form conductive layer 105 from copper, that CMP step removes both the excess copper and the underlying barrier layer. When dielectric layer 103 comprises silicon dioxide, that layer provides a CMP stop layer for such a CMP step.

Figure 1H:
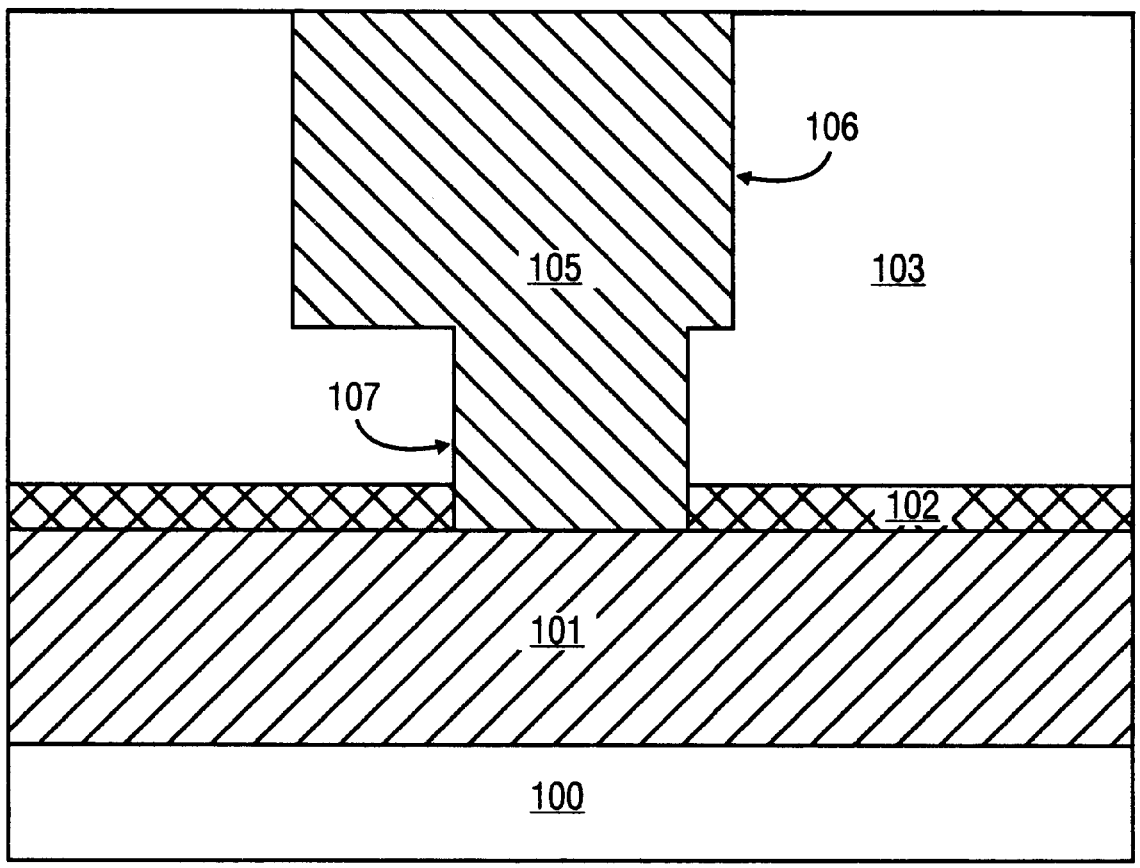

FIG. 1h shows the structure that results after filling trench 106 and via 107 with a conductive material, then applying a CMP step to remove excess material from the surface of layer 103 to produce conductive layer 105. Although the embodiment shown in FIG. 1h shows only one dielectric layer and two conductive layers, the process described above may be repeated to form additional conductive and insulating layers until the desired integrated circuit is produced.

Figure 2A:
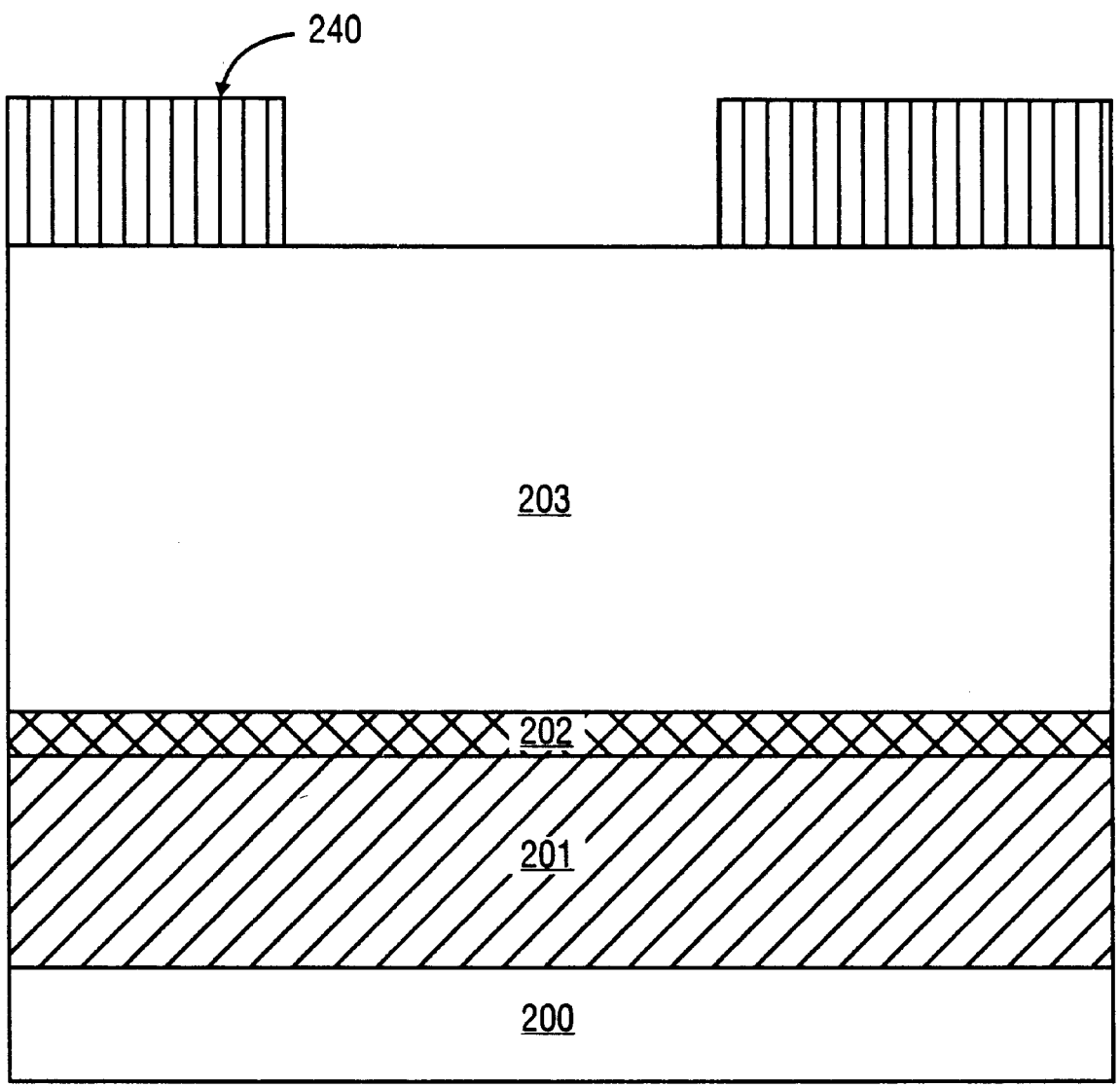
FIGS. 2a–2g illustrate cross-sections that reflect structures that may result after certain steps are used to make a copper containing dual damascene device following a second embodiment of the method of the present invention.
Figure 2B:
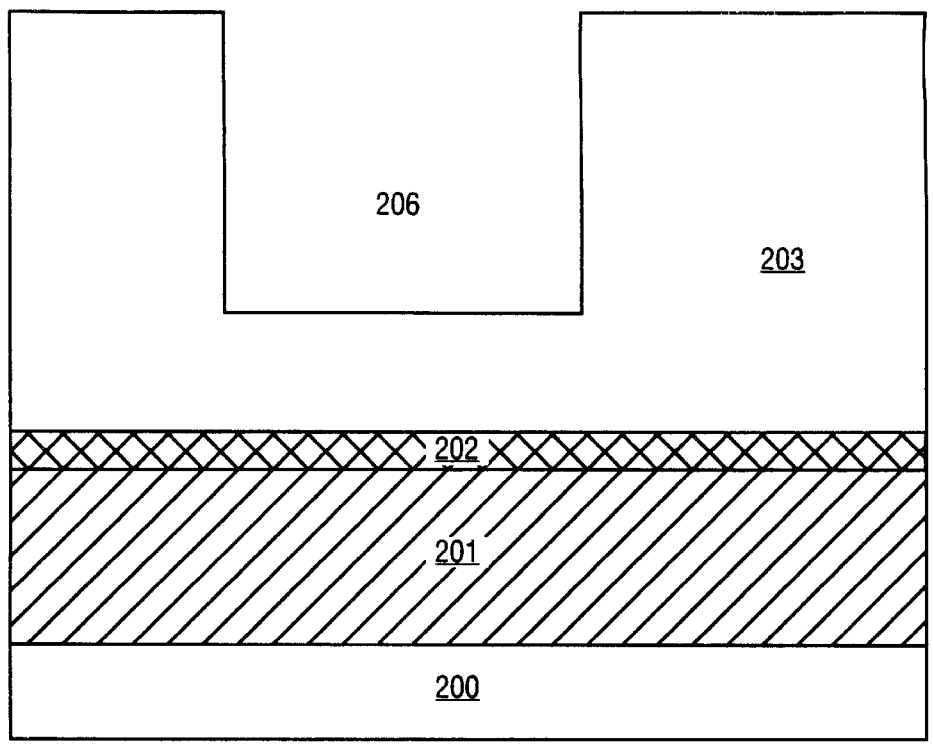
Figure 2C:
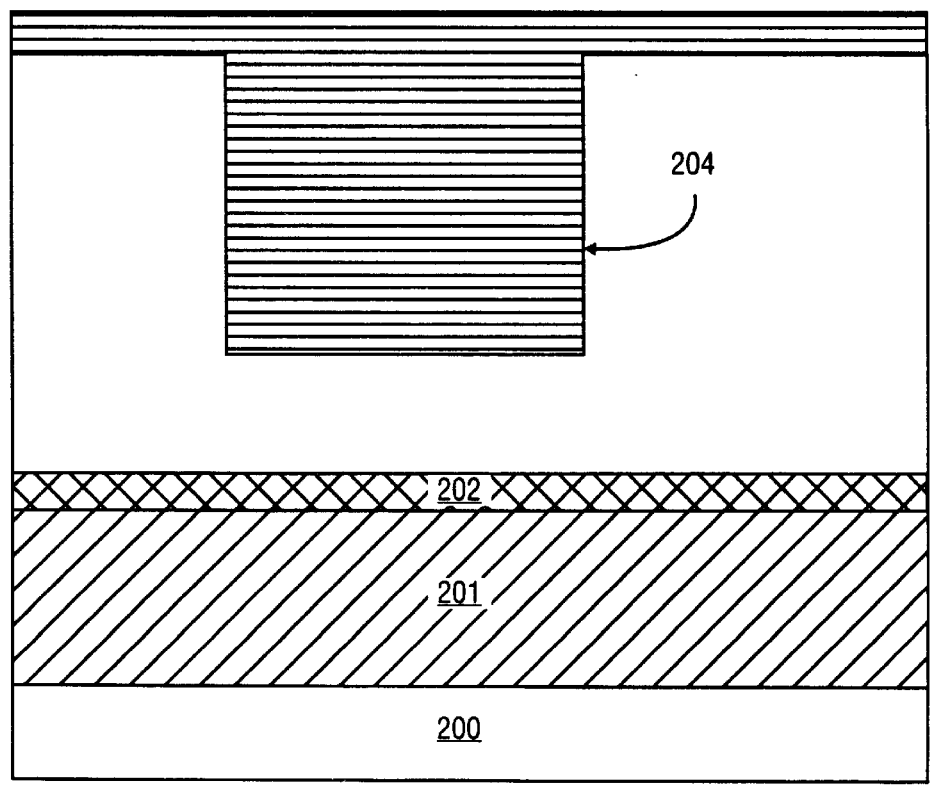
Figure 2D:
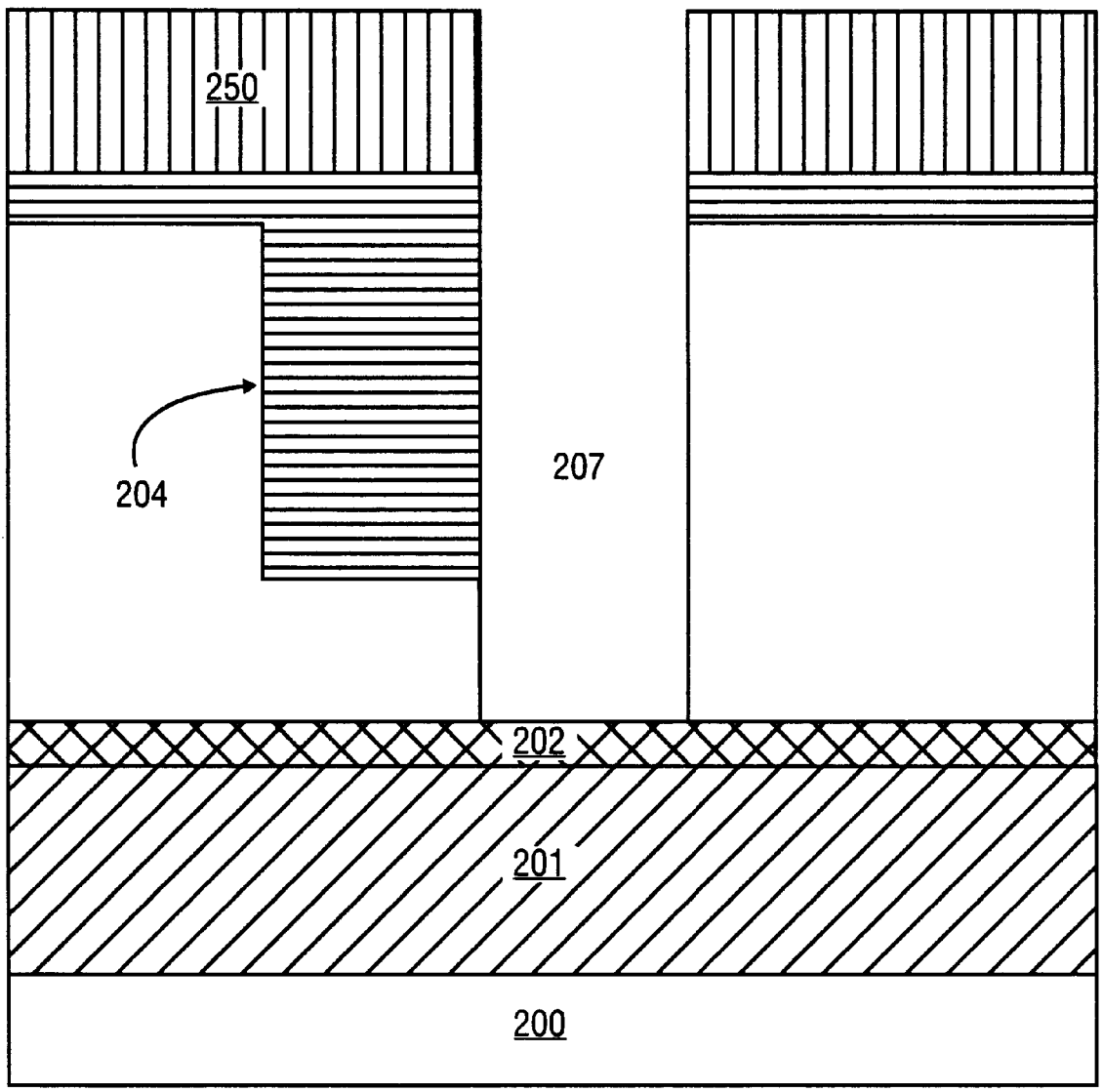
Figure 2E:
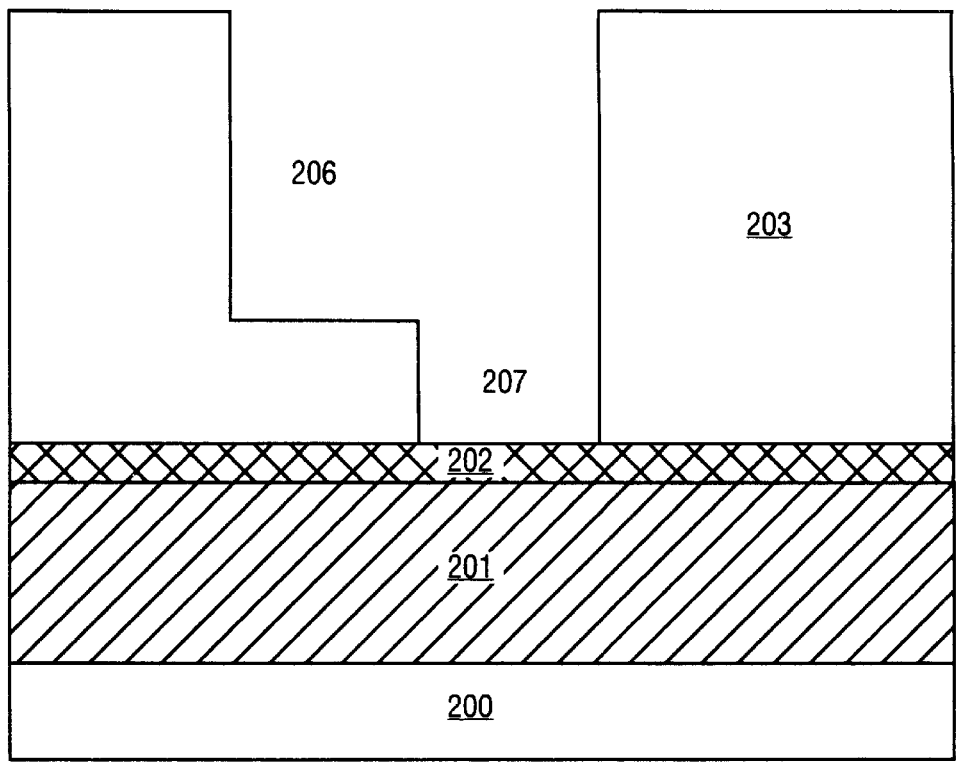

FIGS. 2a–2g represent structures that may be formed when applying a second embodiment of the method of the present invention. FIG. 2a shows a structure similar to the one shown in FIG. 1b, except that photoresist layer 240 is patterned to form the trench instead of the via. After that patterning step, dielectric layer 203 is etched to form trench 206, as shown in FIG. 2b. When dielectric layer 203 is made of silicon dioxide, the trench etch process may be performed using the medium density MERIE system referenced above.

The etching process is applied for a time sufficient to form a trench having the desired depth. Because the trench etch process does not etch completely through dielectric layer 203, barrier layer 202 is not exposed during that process. Because the barrier layer is not exposed, when etching the trench, the chemistry used to etch the trench need not ensure a high etch rate for dielectric layer 203, when compared to the etch rate for barrier layer 202. No longer constrained by that requirement, the trench etch process may be optimized to yield trenches having substantially vertical profiles, substantially flat bottom surfaces, and a more controllable depth, without regard for the selectivity that the chosen etch chemistry produces.

Following the trench etching step, conventional post etch ashing and cleaning steps are performed. Sacrificial material 204 is then applied to the device, e.g., by spin coating it onto the device's surface, which fills trench 206, generating the structure shown in FIG. 2c. As shown, sacrificial material 204 not only fills trench 206, but also creates a substantially planar surface for the subsequent lithographic definition of via 207.

After the trench fill step, photoresist layer 250 is patterned to define via 207. Via 207 is then etched by etching through the exposed portion of sacrificial material 204 and through the underlying portion of dielectric layer 203 to produce the structure shown in FIG. 2d. When dielectric layer 203 is made from silicon dioxide, and sacrificial material 204 is made from SOG, the same oxide etch system used to etch trench 206 may be used to etch via 207.

Other materials may be selected for dielectric layer 203 and sacrificial material 204, as long as the etch chemistry used to etch through those materials to form via 207 ensures removal of dielectric layer 203 and sacrificial material 204 at substantially the same rate. Barrier layer 202 will be etched only during a via overetch step, which may be necessary to account for variation in the thickness of dielectric layer 203.

Etching barrier layer 202 only during the via overetch step enables a significant reduction in the selectivity of dielectric layer 203 to barrier layer 202. By reducing that selectivity requirement, an etch chemistry optimized for making a substantially defect free device that has improved trench and via profiles may be used, instead of an etch chemistry that provides for high selectivity. In addition, because barrier layer 202 is etched for a relatively short time, i.e., only during the via overetch step, a layer that is less than about 600 angstroms thick, when initially deposited, may be used for making devices with improved dielectric properties.

After the via etch step, photoresist layer 250 and the remaining sacrificial material 204 are removed, as are any residues that remain on the surface of the device or inside the vias. A conventional oxygen based plasma ash process may be used to remove the photoresist. After that ashing step, a wet clean step takes place, in which a wet etch chemistry having a much higher selectivity for the remaining sacrificial material over dielectric material 203 is used. Such a wet etch step removes the remaining sacrificial material from both the surface of the device and from within trench 206 to produce the structure shown in FIG. 2e. As in the embodiment described above with reference to FIGS. 1a–1h, conductive layer 201 is protected from the potentially damaging effects of such a wet clean process by the remaining portion of barrier layer 202.

Although sacrificial material 204 preferably may be etched at substantially the same rate that dielectric layer 203 may be etched, when using a dry etch chemistry, sacrificial material 204 should etch at a significantly faster rate than dielectric layer 203 during the via clean process. That characteristic ensures that substantially all of sacrificial material 204 is removed during the via clean step, without removing a substantial amount of dielectric layer 203.

Figure 2F:
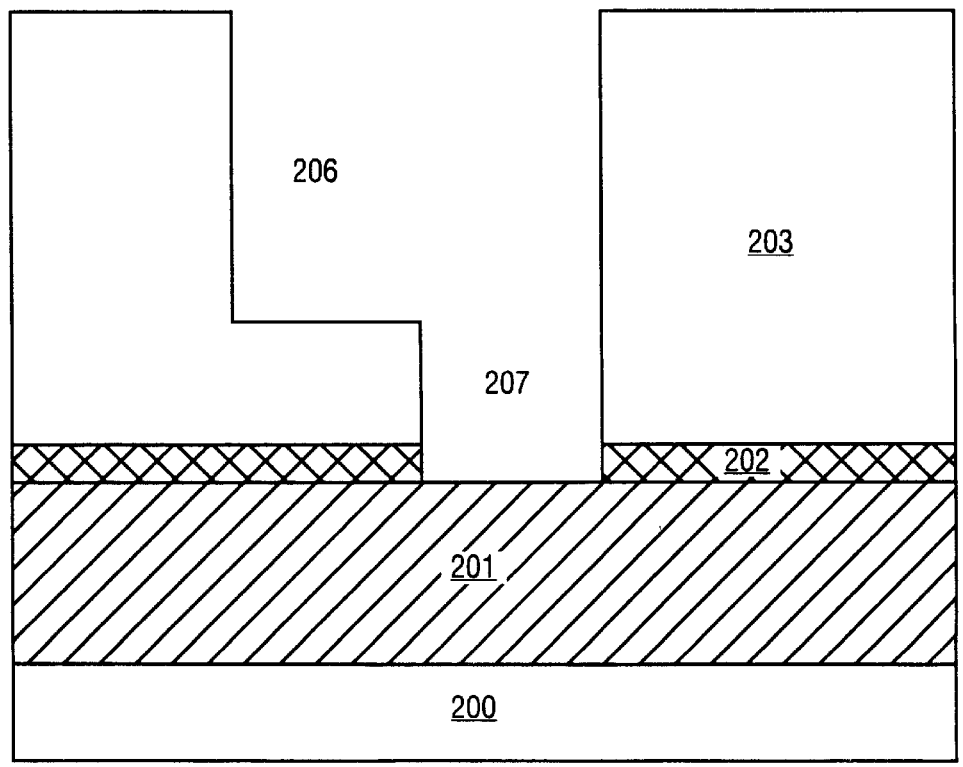
Figure 2G:
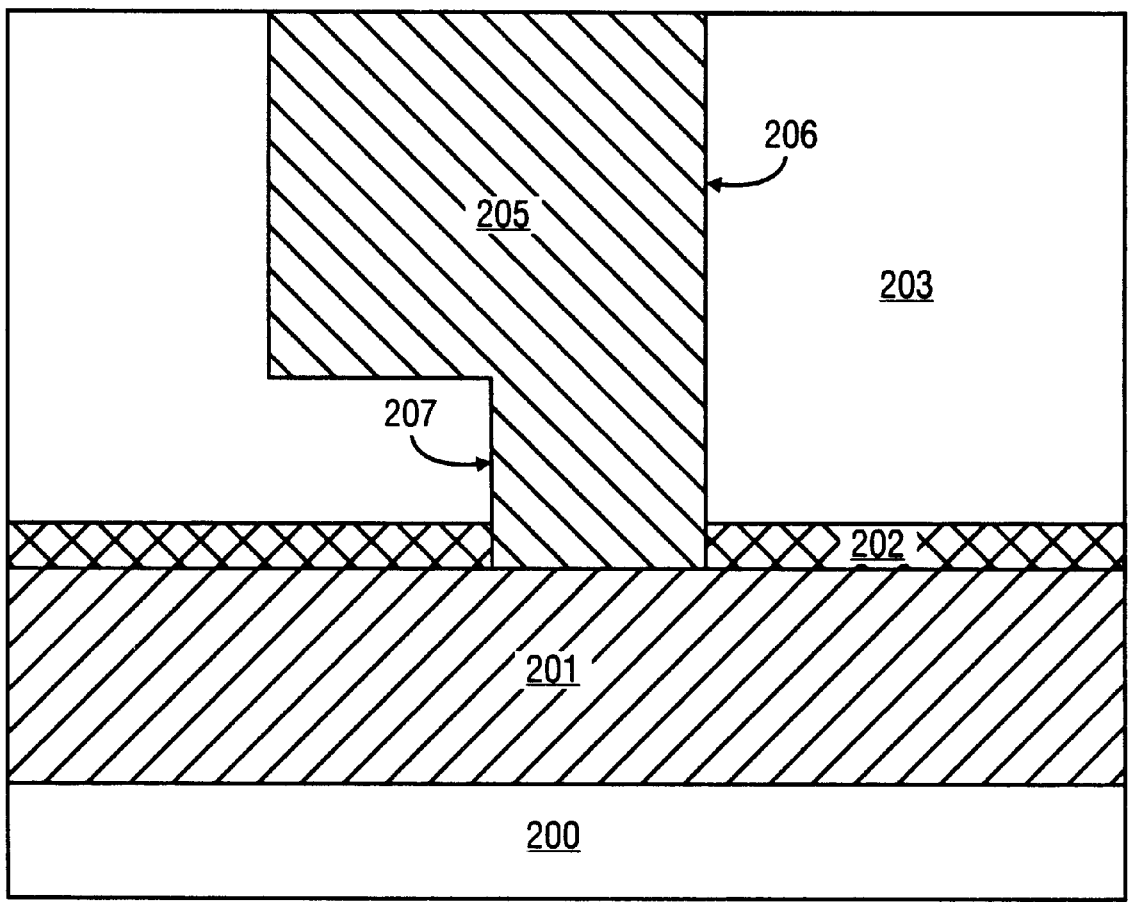

After the via clean step, the exposed portion of barrier layer 202, which preferably comprises silicon nitride, is etched—preferably using an etch chemistry that does not produce a significant amount of polymer. As mentioned above, in connection with the embodiment of the present invention described with reference to FIGS. 1a–1h, that barrier layer etch step may be followed by a short cleaning step that removes residue that may remain on the surface of conductive layer 201. The resulting structure is shown in FIG. 2f. Trench 206 and via 207 may then be filled with a conductive material, e.g., copper. Following any appropriate CMP step, the structure shown in FIG. 2g is created.

Figure 3A:
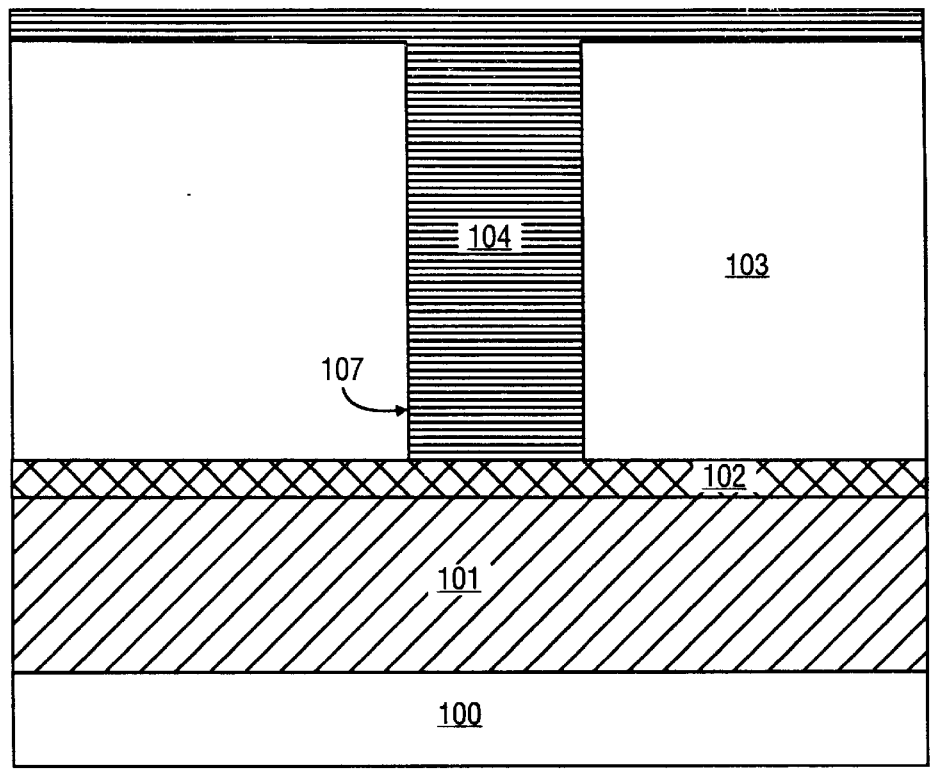
FIGS. 3a–3c illustrate cross-sections that reflect structures that may result after certain steps are used to make a copper containing dual damascene device following a third embodiment of the method of the present invention.
Figure 3B:
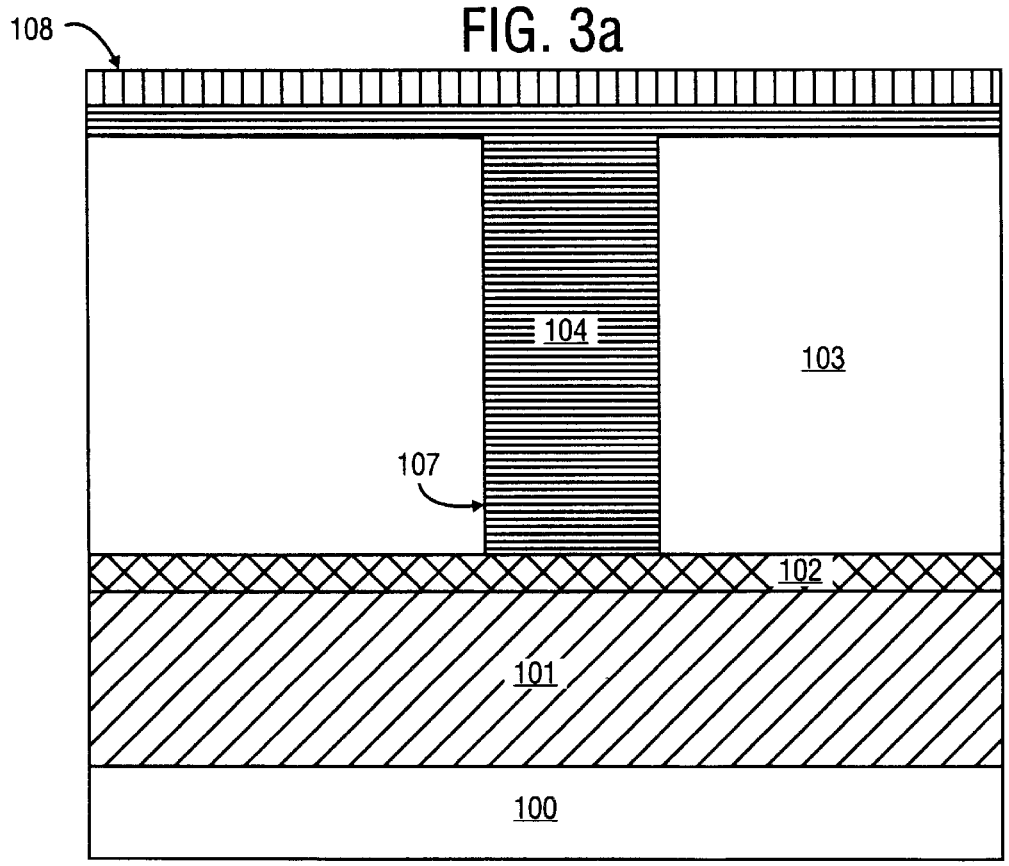
Figure 3C:
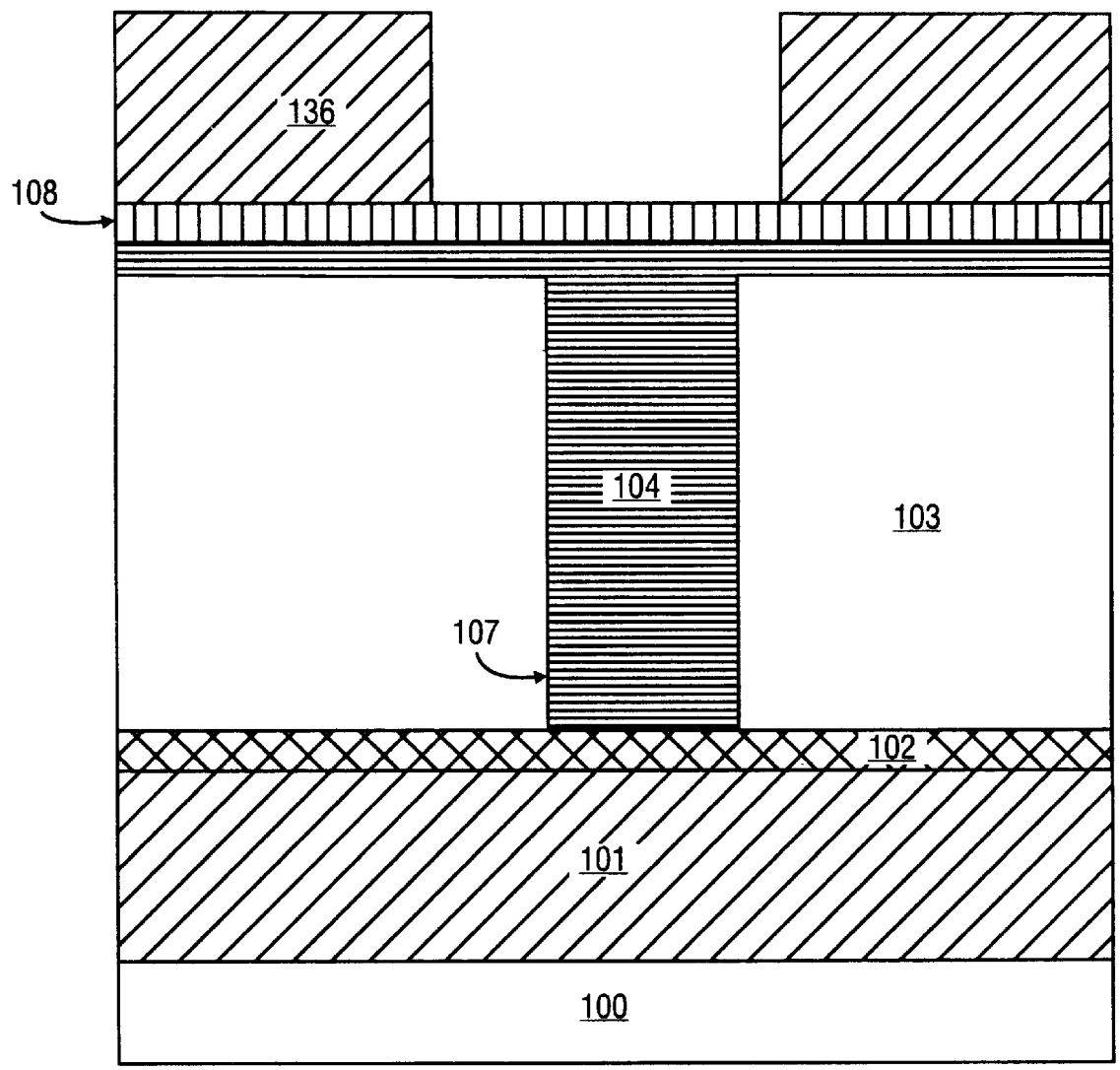

FIGS. 3a–3c illustrate a variation of the process described above in connection with FIGS. 1a–1h. In this variation, process steps specified above may be used to generate the structure shown in FIG. 3a. (Similar numbers are used in FIGS. 1a–1h and 3a–3c to represent similar structures.) In this variation, sacrificial material 104 may be transparent. As described above, sacrificial material 104 may comprise an SOP or SOG, which was spin coated onto dielectric layer 103, filling via 107 and covering dielectric layer 103. Because in this embodiment of the present invention an antireflective layer will be formed on sacrificial material 104, the SOP or SOG used to fill via 107 does not need to be a dyed material to reduce substrate reflectivity.

Antireflective layer 108 is formed on sacrificial material 104. In the resulting structure, represented by FIG. 3b, antireflective layer 108 preferably is between about 400 and about 1,000 angstroms thick. Antireflective layer 108 may comprise an organic or inorganic material. Suitable organic materials that may be used to produce a low reflectance substrate include commercially available bottom antireflective coatings ("BARCs"). Conventional spin coating techniques may be used to apply such materials to the surface of sacrificial material 104. Suitable inorganic materials include silicon nitride, silicon carbide, and titanium nitride. Such materials may be deposited onto the underlying layers using conventional chemical vapor deposition techniques (e.g., PECVD) that are generally known to those of ordinary skill in the art.

The material chosen for antireflective layer 108 should reduce reflection at the wavelength of light used in the subsequent photolithographic process employed to define the line/space pattern. Such a material will reduce (or perhaps eliminate) any adverse impact on CD control and uniformity that could result from the high substrate reflectivity that may be caused by exposing a transparent material during the lithographic process used to define the trench. In addition, that material should be removable from the wafer using a conventional photoresist removal or chemical etch process.

After forming antireflective layer 108, a layer of photoresist is applied, exposed and developed, using conventional photolithography steps, to produce the structure shown in FIG. 3c, in which photoresist layer 136 defines the trench. After those lithographic steps, the trench is etched as follows. Initially, the exposed portion of antireflective layer 108 is removed. When layer 108 comprises a BARC material, layer 108 may be removed using a process like that conventionally used to remove photoresist. (Although such a process may remove part of photoresist layer 136 at the same time, the amount of photoresist removed will not affect subsequent lithographic steps.) When antireflective layer 108 comprises an inorganic material, the exposed portion of that layer may be removed using conventional selective (to dielectric layer 103) etch chemistry and processes for removing such materials. After removing that portion of layer 108, dielectric layer 103 and sacrificial material 104 are etched to create the trench, using the process steps described above in connection with FIGS. 1e and 1f.

After the trench is etched, the photoresist is removed, e.g., by using a conventional photoresist ashing step. When layer 108 comprises a BARC material, the remaining portion of that layer may be removed at the same time the photoresist is removed. When layer 108 comprises an inorganic material, the remaining portion of that layer may be removed using the same chemistry and process that had been used to remove the exposed portion of layer 108 prior to etching the trench. Following the photoresist and antireflective layer removal steps, those portions of sacrificial material 104 that remained after the trench was etched are removed (e.g., by using process steps described above), as are any dry etch residues, to produce the structure shown in FIG. 1f. Subsequent processing follows, as described above, to generate the structure shown in FIG. 1h. Although this variation of the method of the present invention has been described in the context of a process that forms the via before the trench (like the process shown in FIGS. 1a–1h), this variation may similarly be applied to processes that form the trench before the via (like the process shown in FIGS. 2a–2g).

The improved method for making an integrated circuit of the present invention enables improved lithography and the use of etch chemistry that provides for a lesser degree of silicon dioxide to silicon nitride selectivity than may otherwise be required. Such a method enables improved line and spacing definition and enables a thinner silicon nitride layer to adequately protect the surface of the underlying conductive layer. It also promotes superior via and trench profiles.

Although the foregoing description has specified certain steps, materials, and equipment that may be used in such a method to make such an integrated circuit, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of forming an integrated circuit comprising:
    forming a conductive layer on a substrate;
    forming a dielectric layer on the conductive layer;
    patterning a layer of photoresist, after forming the dielectric layer, to define a region to be etched;
    forming a first etched region by removing a first portion of the dielectric layer;
    filling the first etched region with a sacrificial material that is selected from the group consisting of a dyed SOP and a dyed SOG and that has dry etch properties similar to those of the dielectric layer; and
    forming a second etched region by removing the sacrificial material and a second portion of the dielectric layer.

2. The method of claim 1 wherein the sacrificial material has the following properties:
    it may be dry etched at substantially the same rate that the dielectric layer may be dry etched;
    it may be wet etched at a significantly faster rate than the dielectric layer may be wet etched;
    it may absorb light having a wavelength that is identical to the wavelength used to expose the photoresist to pattern it; and
    it may completely and uniformly fill the first etched region.

3. The method of claim 2 further comprising:
    forming a barrier layer on the surface of the conductive layer prior to forming the dielectric layer;
    forming the first and second etched regions without first forming a second barrier layer on the surface of the dielectric layer;
    removing part of the barrier layer after forming the second etched region; and
    filling the first and second etched regions with a second conductive layer.

4. The method of claim 2 wherein the integrated circuit will include a dual damascene interconnect, and wherein the first etched region forms the via for the interconnect and the second etched region forms the trench for the interconnect.

5. The method of claim 2 wherein the integrated circuit will include a dual damascene interconnect, and wherein the first etched region forms the trench for the interconnect and the second etched region forms the via for the interconnect.

6. A method of forming an integrated circuit having a dual damascene interconnect comprising:
    forming a first conductive layer on a substrate;
    forming a barrier layer on the surface of the first conductive layer;
    forming a dielectric layer on the surface of the barrier layer;
    patterning a first layer of photoresist, after forming the dielectric layer, to define a via;
    forming a via through a first portion of the dielectric layer without first forming a second barrier layer on the surface of the dielectric layer;
    filling the via with a sacrificial layer that may be dry etched at a slightly faster rate than the dielectric layer and that comprises a material selected from the group consisting of a dyed SOP and a dyed SOG;
    patterning a second layer of photoresist to define a trench;
    forming a trench within the dielectric layer by removing the sacrificial layer and a second portion of the dielectric layer, the sacrificial layer being removed at a faster rate than the dielectric layer is removed; and
    filling the via and trench with a second conductive layer.

7. The method of claim 6 further comprising removing a portion of the barrier layer after forming the trench.

8. The method of claim 6 wherein the dielectric layer comprises silicon dioxide, the barrier layer comprises silicon nitride, and the first and second conductive layers comprise copper.

9. The method of claim 8 wherein the sacrificial layer has the following properties:

it may be wet etched at a significantly faster rate than the dielectric layer may be wet etched;

it may absorb light having a wavelength that is identical to the wavelength used to expose the photoresist to pattern it; and it may completely and uniformly fill the via.

10. A method of forming an integrated circuit having a dual damascene interconnect comprising:

forming a first conductive layer on a substrate;

forming a barrier layer on the surface of the first conductive layer;

forming a dielectric layer on the surface of the barrier layer;

patterning a first layer of photoresist, after forming the dielectric layer, to define a trench;

forming a trench within a first portion of the dielectric layer;

filling the trench with a sacrificial layer selected from the group consisting of a dyed SOP and a dyed SOG;

patterning a second layer of photoresist to define a via;

forming a via through the dielectric layer by removing the sacrificial layer and a second portion of the dielectric layer; and filling the via and trench with a second conductive layer.

11. The method of claim 10 further comprising removing a portion of the barrier layer after forming the via.

12. The method of claim 10 wherein the dielectric layer comprises silicon dioxide, the barrier layer comprises silicon nitride, and the first and second conductive layers comprise copper.

13. The method of claim 12 wherein the sacrificial layer etches at a faster rate than the silicon dioxide layer.

14. A method of forming an integrated circuit comprising:

forming a conductive layer on a substrate;

forming a dielectric layer on the conductive layer;

patterning a layer of photoresist, after forming the dielectric layer, to define a region to be etched;

forming a first etched region by removing a first portion of the dielectric layer without first forming a barrier layer on the surface of the dielectric layer;

filling the first etched region with a sacrificial material that is selected from the group consisting of an SOP and an SOG and that has dry etch properties similar to those of the dielectric layer;

forming an antireflective layer on the sacrificial material; and forming a second etched region by removing the antireflective layer, the sacrificial material and a second portion of the dielectric layer.

15. The method of claim 14 wherein the sacrificial material has the following properties:

it may be dry etched at substantially the same rate that the dielectric layer may be dry etched;

it may be wet etched at a significantly faster rate than the dielectric layer may be wet etched;

it may absorb light having a wavelength that is identical to the wavelength used to expose the photoresist to pattern it; and it may completely and uniformly fill the first etched region.

16. The method of claim 15 further comprising:

forming a barrier layer on the surface of the conductive layer prior to forming the dielectric layer;

removing part of the barrier layer after forming the second etched region; and filling the first and second etched regions with a second conductive layer.

17. The method of claim 15 wherein the integrated circuit will include a dual damascene interconnect, and wherein the first etched region forms the via for the interconnect and the second etched region forms the trench for the interconnect.

18. The method of claim 15 wherein the integrated circuit will include a dual damascene interconnect, and wherein the first etched region forms the trench for the interconnect and the second etched region forms the via for the interconnect.

19. The method of claim 15 wherein the antireflective layer is between about 400 and about 1,000 angstroms thick.

20. The method of claim 15 wherein the antireflective layer comprises a material selected from the group consisting of an organic bottom antireflective coating, silicon nitride, silicon carbide, and titanium nitride.

* * * * *